United States Patent [19]
Van Anrooy

[11] 3,821,654
[45] June 28, 1974

[54] WIDEBAND DISCRIMINATOR CIRCUIT WITH IMPROVED OPERATING CHARACTERISTICS

[75] Inventor: Peter H. Van Anrooy, Itasca, Ill.
[73] Assignee: Motorola, Inc., Franklin Park, Ill.

[22] Filed: Feb. 20, 1973
[21] Appl. No.: 333,575

[52] U.S. Cl. ............ 329/103, 178/5.4 SD, 307/233, 328/133, 329/50, 329/140, 330/30 D
[51] Int. Cl. ............ H03d 3/18
[58] Field of Search ............ 329/50, 140, 103, 101; 328/133; 178/5.4 SD; 307/233; 330/30 D

[56] References Cited

UNITED STATES PATENTS

| | | | |
|---|---|---|---|
| 3,241,078 | 3/1966 | Jones | 329/50 |
| 3,355,669 | 11/1967 | Avins | 329/103 |
| 3,430,151 | 2/1969 | Badessa | 329/50 |
| 3,651,418 | 3/1972 | Wittmann | 330/30 D X |
| 3,702,442 | 11/1972 | Janssen et al. | 307/233 X |

*Primary Examiner*—Alfred L. Brody
*Attorney, Agent, or Firm*—Donald B. Southard; Vincent J. Rauner

[57] ABSTRACT

A wideband frequency discriminator arrangement with extended pull-in range is disclosed, which is especially suited for application in automatic fine tuning systems of television receivers. The discriminator circuit is in integrated circuit form and is of a balanced type arrangement to effectively cancel out or neutralize any spurious signal information or other unwanted distortion components. The circuit arrangement includes respective input terminals for receiving derived push-pull television signals, which are then amplified and applied to respective synchronous switches. The amplified signal is also applied further to one of a pair of transistor amplifiers having an inductive reactance interconnecting their emitter circuits and an additional tuned circuit interconnecting their collector circuits. Accordingly, any deviation from the precise desired frequency results in a difference in phase which when applied to the synchronous switches effects an output with a d-c component which may be utilized for controlling the appropriate portion of the receiver, such as the voltage controlled local oscillator in the tuner mechanism.

10 Claims, 5 Drawing Figures

PATENTED JUN 28 1974

3,821,654

WIDEBAND DISCRIMINATOR CIRCUIT WITH IMPROVED OPERATING CHARACTERISTICS

BACKGROUND OF THE INVENTION

This invention relates in general to discriminator circuits and more particularly to an improved wideband discriminator arrangement, preferably in integrated circuit form, and adaptable for effecting automatic fine tuning in a television receiver.

Frequency discriminators have a wide variety of usage in the electronic arts, one of which may be found in automatic fine tuning (AFT) systems. Such discriminator arrangements are utilized to generate an error voltage, corresponding to the degree of mistuning encountered at any particular time, for selectively controlling the frequency of a voltage controlled local oscillator at an appropriate location within the receiver so as to effect the desired correct tuning.

While there have been some frequency discriminator circuits heretofore of one type or another, certain operational deficiencies are encountered with respect to television applications. A number of prior art arrangements are simply ineffective over the required frequency range or bandwidth. Beyond a particularized frequency providing peak response, such discriminators may actually result in a further mistuning rather than a reduction in the exhibited tuning error. Still others, while providing acceptable operational characteristics, are nevertheless too expensive, too complex, too high in operating power requirements, or simply occupy excessive physical space.

SUMMARY OF THE INVENTION

Accordingly, it is an object of the present invention to provide a wideband discriminator arrangement with improved operating characteristics.

A more particular object of the present invention is to provide an improved wideband discriminator arrangement especially suited for utilization in automatic fine tuning systems of television receivers.

Another object of the present invention is to provide a wideband discriminator of the foregoing type in a balanced design configuration wherein spurious signal information and other undesirable distortion is effectively neutralized.

Yet another object of the present invention is to provide a wideband discriminator of the foregoing type capable of effecting a correcting voltage of given amplitude at frequencies greatly removed from the desired center frequency.

A further object of the present invention is to provide a wideband discriminator of the foregoing type which is especially suited for AFT application in a television receiver and wherein the apparatus is more reliable, considerably simplified, less expensive and more conveniently adaptable to integrated circuit form.

In accordance with the stated objectives, the present invention provides a wideband frequency discriminator circuit having a pair of input terminals for receiving push-pull signals that have been detected and derived by conventional television circuitry. The respective signals are amplified in associated transistor amplifiers, the outputs of which are applied to associated synchronous switches and, further, to an associated one of a pair of transistor amplifiers having their emitters interconnected by an inductive reactance and a parallel tuned circuit interconnecting their collector circuits, the latter serving as a narrowband filter.

Accordingly, the push-pull signal at the output of the first transistor amplifier is applied as a control or source signal to an associated synchronous switch. The signal output from the associated one of the pair of emitter-coupled transistor amplifiers, having the current waveform thereof retarded by 90° by the inductive reactance common to the emitter circuits, is applied to another input of the synchronous switch and serves as a gating signal. When the incoming signal to the discriminator circuit is precisely on frequency, the output waveform exhibits substantially identical positive and negative going portions or half cycles such that the respective waveforms portions or half cycles cancel one another and the output of the synchronous switch is substantially zero with respect to any d-c component. However, if there is some initial mistuning, the derived television signal will deviate from the exact resonant frequency of the tuned circuit between the collectors of the referenced second and third transistor amplifiers. The resultant increase, or decrease, in phase of the signal as it passes through the tuned filter changes the balanced nature of the synchronous switch and the resultant waveform produced at the output thereof will thus include a d-c component of a polarity and amplitude directly dependent upon the direction and the degree of the initial mistuning.

BRIEF DESCRIPTION OF THE DRAWINGS

The features of the present invention which are believed to be novel are set forth with particularity in the appended claims. The invention, however, together with further objects and advantages thereof, may be best understood by reference to the accompanying drawings, in which:

Figure 1:
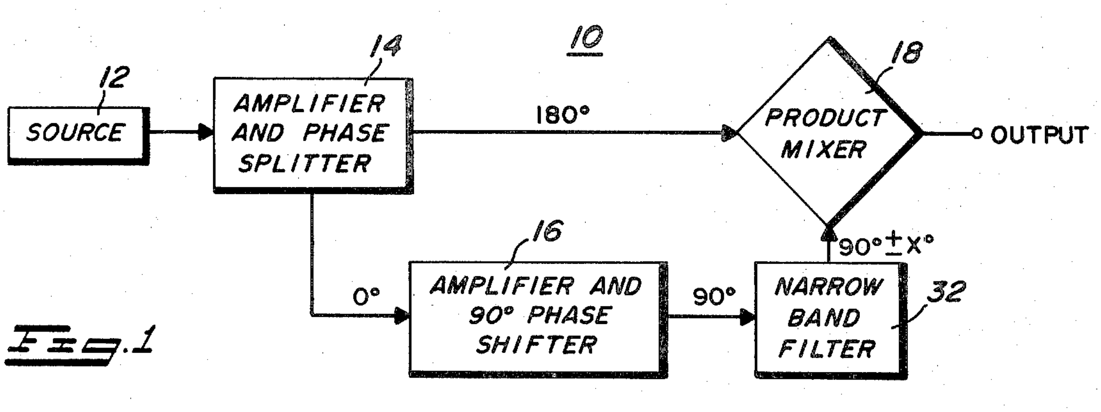
FIG. 1 is a block diagram of the wideband discriminator arrangement constructed in accordance with the present invention.

Referring now to the drawings, a wideband discriminator arrangement 10 is shown in block diagram form in FIG. 1. As would be expected, the discriminator 10 is intended to provide an error voltage of, or with, a significant d-c component in response to a tuning error which may be conveniently utilized in an automatic fine tuning (AFT) system in a television receiver of one sort or another so as to initiate appropriate control action to effect the desired "on-frequency" tuning condition. It is to be noted that the AFT arrangement may be of any suitable or conventional type known in the art such that further and more detailed description should not be necessary. Similarly, since the remaining portion of the receiver is likewise conventional, further and more descriptive analysis should not be required nor necessary regarding the full appreciation of the present invention.

As will be noted, the discriminator arrangement 10 of FIG. 1 includes means for suitably deriving a source of television signal, as indicated generally at 12. The derived signal information, the frequency of which is to be monitored, is fed to an amplifier and phase splitter 14 where it is amplified and split into respective in-phase and out-of-phase portions, one of which, say the in-phase portion, is fed to still another amplifier stage 16, wherein a further 90° phase shift in the current waveform is imposed. The other output of amplifier stage 14, in this case, the out-of-phase portion, is fed directly to a product mixer 18. The output of amplifier stage 16 is likewise applied to product mixer 18, but through an intervening narrow-band filter arrangement, as indicated at 20.

Accordingly, it will be appreciated that when the signal derived by source 12 exhibits a frequency substantially the same as the natural resonant frequency of the tuned narrow-band filter arrangement 20, no additional phase shift is imposed on the signal as translated therethrough. This means that the signal information at respective inputs to the product mixer 18 are at 90° references with respect to one another or, more simply, in phase quadrature. Under these conditions, the output waveform from the product mixer 18 will be one in which the positive and negative going portions thereof are substantially equal to one another, and thus no d-c component will be evidenced. However, if the applied signal information from source 12 differs from the precise resonant frequency of filter 20, a phase shift will necessarily be introduced in the signal as translated therethrough, the value of which will depend directly upon the extent of the deviation. The additional increase or decrease in phase, as the case may be, changes the precise quadrature relationship between respective input signals to mixer 18, and the output waveform will now exhibit a d-c component. The amplitude thereof depends of course upon the degree of initial mistuning of the receiver as a whole.

Figure 2:
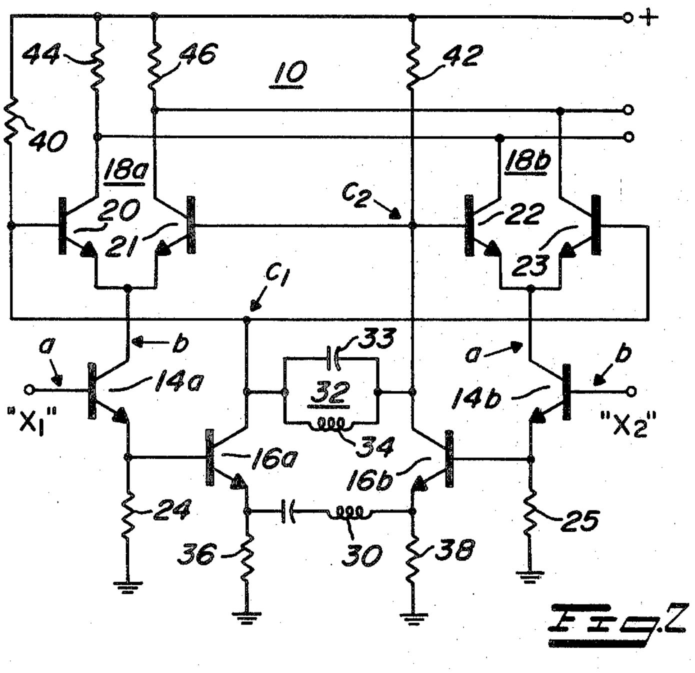
FIG. 2 is a schematic diagram of the discriminator as shown in FIG. 1.

A schematic diagram of a successful wideband discriminator constructed in accordance with the principles of the present invention is shown in FIG. 2. The discriminator is provided in integrated circuit form of a substantially balanced configuration, both as to signal drive and signal output, so as to eliminate or neutralize any spurious signal information or other distortions that may otherwise be encountered. Circuit 10 is intended to receive push-pull signals of the derived picture carrier, i.e., approximately 45.75 mz. The derived push-pull signals are applied to respective input terminals, identified at $X_1$ and $X_2$, and then amplified in an associated transistor amplifier, **14*a* or 14*b*. The signal at the collectors thereof are reversed in phase with respect to the base inputs, while that of the emitters are of the same phase. Accordingly, it will be appreciated that transistor amplifiers 14*a* and 14*b*** additionally function as phase splitters.

As will be noted, the output at the collector of each of the amplifiers **14*a* and 14*b* is coupled to an associated product mixer, 18*a* or 18*b*, comprised of a pair of transistors having interconnected emitters. The collector of amplifier 14*a* is coupled to the emitter junction point of the pair of transistors 20 and 21, forming product mixer 18*a*, with the collector of amplifier 14*b* being coupled to the emitter junction point of still another pair of transistors 22 and 23, forming product mixer 18*b*. As will also be noted, the in-phase portion of the amplified signal appearing at the emitters of transistor amplifiers 14*a* and 14*b* are also coupled to the base input of a respective one of the additional transistor amplifiers 16*a* and 16*b*. An inductance 30 interconnects the emitters of transistors 16*a* and 16*b*, while a tuned circuit 32, comprised of a capacitor 33 and an inductance 34, interconnects the collectors of the transistors 16*a* and 16*b*. Resistances 36 and 38 serve as the loads for the emitters of transistors 16*a* and 16*b*. Resistances 24 and 25 serve a similar purpose with respect to transistor 14*a* and 14*b*, respectively. Operating power is supplied to transistors 16*a* and 16*b* by associated resistances 40 and 42 coupled to a source of unidirectional potential. Operating power is likewise applied to transistors 20–21 and 22–23, and in turn to transistors 14*a* and 14*b*, by associated resistance 44 and 46.**

Figure 3:
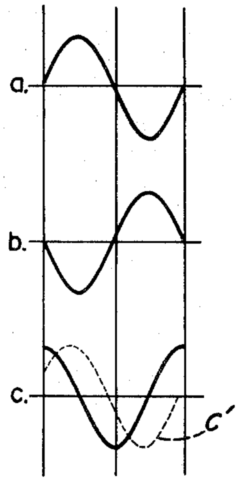
FIG. 3 is a graphic representation of various waveforms useful in understanding certain aspects of the present invention.

In operation, the push-pull signals of the derived picture carrier are applied to respective input terminals $X_1$ and $X_2$. For convenience, it may be assumed that the applied waveform is essentially sinusoidal, such as those depicted in FIG. 3. The signal of a given reference phase indicated at "*a*" may be applied to input terminal X, while the signal of alternate phase as depicted at "*b*" is applied to the other referenced input terminal $X_2$. Considering one half of the discriminator's operational cycle, say the left half, the waveform "*a*" impressed at the base-input of transistor **14*a*, is translated therethrough and applied to the base-input of transistor 16*a* without change in phase. However, the output of transistor amplifier 14*a*** at its collector will be reversed in phase, as depicted by the waveform segment "*b*" illustrated in FIG. 3. This waveform likewise appears at the emitter junction point of transistors 20 and 21, and in effect serves as the initial or source signal for the product mixer **18*a* operating as a synchronous switch. The respective gating signals for product mixer 18*a*, applied at the base-inputs of transistors 20 and 21, are obtained at the collector outputs of transistors 16*a* and 16*b*. With the inductance 30 in the emitter circuits of amplifiers 16*a* and 16*b*, it will be appreciated that the current waveform will necessarily lag that of the voltage by essentially 90°. Thus, the signal information appearing at the collector of transistor amplifier 16*a*, and applied to the base-inputs of transistors 20 and 23 in common, is effectively in quadrature with that as applied to the common emitter junction point of transistors 20 and 21.** This is represented graphically by the waveform segment "*c*" shown in solid line in FIG. 3. Similarly, it will be appreciated that if the signal information as translated through filter network 32 is substantially at the resonant frequency of the filter, there will be no appreciable phase shift in the translated signal. Consequently, the signal information appearing at reference terminal point "$c_2$," and applied to base-inputs of transistors 21 and 22, is substantially the same as that at reference terminal point "$c_1$." Accordingly, the source current derived by transistor amplifier **14*a* selectively passes through transistors 20 and 21 while the source current derived by transistor amplifier 14*b* is selectively routed through transistors 22 and 23. Of course, it is to be noted that when transistors 21 and 22 are render conductive, transistors 20 and 23** are effectively cut off, and visa versa.

Figure 4:
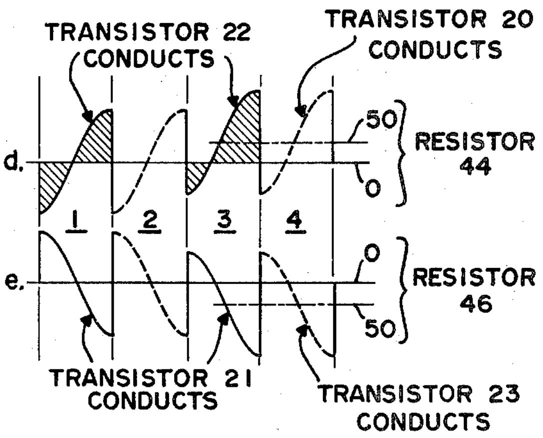
FIG. 4 is a graphic representation of waveforms at the outputs of the discriminator circuit showing a presence or absence of a d-c component.
Figure 5:
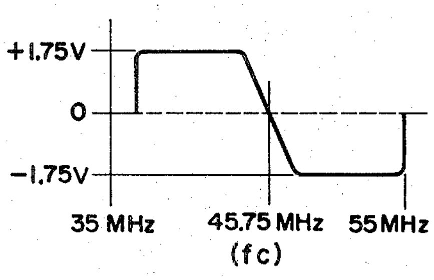
FIG. 5 is a graphic representation of the frequency response of the discriminator disclosed herein as applied to television application.

With the collector of transistor 22 being cross-connected to the collector of transistor 20, the output waveform appearing across resistor 44 will be substantially as that depicted at reference "$d$," FIG. 4, at least during time intervals 1 and 2. As indicated, transistors 20 and 22 alternately conduct and the positive and negative half cycles of the subject waveform are substantially equal such that no d-c component will be present. That is, the respective areas of the alternate half cycles of the output waveform above and below zero reference "0" are the same, as graphically represented by the cross-hatching in the 1st time interval for waveform "$d$" in FIG. 4, wherein transistor 22 is conductive. The same is true of course for transistor 20 conducting during time interval 2.

Similarly, the collector of transistors 21 and 23 are cross connected such that the output waveform across resistor 44 is substantially as that indicated at reference "$e$," FIG. 4. Again, transistors 21 and 23 alternately conduct and the positive and negative half cycles are substantially equal during time intervals 1 and 2 so as to preclude the presence of any d-c component in the output across resistor 46 and, accordingly, no error voltage will be evident with which to effect a frequency change through the action of the associated automatic fine tuning control system of the television receiver.

On the other hand, however, if the signal as applied to the discriminator input terminals $X_1$ and $X_2$ differs from nominal picture carrier frequency, i.e., 45.75 mHz, some phase shift will be imposed on the signal information as translated through filter network 32 and applied to the base-input electrodes of transistors 20–23, inclusive. The degree of phase shift will of course depend upon how far and in what direction the signal information translated through filter 32 deviates from nominal, and in turn the resonant frequency of filter 32. For illustrative purposes, it may be assumed that the resultant phase shift produces a waveform as shown in dotted line at $c^1$, FIG. 3.

Since there now is a difference in phase between the signal information as applied to the base-inputs of transistors 20–23, and that as applied to the emitters of the respective transistor pairs 20–21 and 20–23, the previously described quadrature relation no longer obtains. Consequently there will be a change in the manner in which the signal current selectively passes through the referenced transistor pairs. That is, there is a difference between the positive and negative going half cycles extending above and below reference zero. This is represented in the graphic form in FIG. 4 during the time intervals 3 and 4. As will be noted, the respective areas above and below reference zero are no longer equal such that a d-c component is now generated in the output waveform, the level of which is indicated generally at reference 50.

As might be surmised, the polarity of the referenced d-c component 50 is dependent upon whether the signal as translated thru filter network 32 is caused to lead or lag the applied signal information. Similarly, the magnitude of the resultant d-c component is determined by the amount of phase shift imposed on the signal translated through filter network 32. As will be appreciated by those skilled in the art, the d-c component in the output waveform may be utilized for conventional automatic fine tuning circuitry adapted for television receiver usage to maintain correct tuning, electronically and automatically. Usually, the output from the associated product mixer 18$a$ or 18$b$ is coupled to the input of an included voltage controlled oscillator usually in the receiver's tuner mechanism (not shown). The derived d-c voltage is then utilized to alter the frequency of the oscillator until such time as the desired or correct tuning is obtained, and the d-c component is no longer generated.

The response characteristic of the discriminator 10 is depicted graphically in FIG. 4. More properly, it is the response characteristic as may be obtained from one of the two outputs, namely, across resistance 44, and which shows the level of the d-c component that will be generated with respect to frequency. As may be appreciated, the response of the other output at resistance 46 will be substantially the same, but of reversed polarity. As will be noted, the pull-in range of the discriminator 10 when adapted for television usage approximates some 20 mHz. With an input signal of approximately 75 millivolts (r.m.s.) at terminals $X_1$ and $X_2$, an output of approximately 3.5 volts peak-to-peak maybe expected as typical. It is to be especially noted that the voltage level of the generated d-c component rises or falls on a substantially linear response until the 1.75 volt plateau is reached, at which time it remains essentially constant until the outer limit is reached at either extreme. This effectively avoids the problem in discriminators exhibiting a sinusoidal response characteristic of one sort or another wherein the receiver can actually be further mistuned, rather than pulled-in toward a desired frequency, if the tuning error does not fall within certain prescribed limits.

While the particularized embodiment of the present invention has been set forth and described therein it will, of course, be appreciated that certain modifications and alternative constructions may be made without departing from the true scope and spirit of present invention. Accordingly, it is intended that the appended claims cover all such modifications and alternative constructions that fall within their true spirit and scope.

What is claimed is:

1. A wideband discriminator arrangement with extended pull-in range for receiving a source of signal information, the frequency of which is to be monitored comprising in combination:

first circuit means coupled to said source for providing a pair of amplified signal outputs reversed in phase with respect ot one another;

second circuit means coupled to one of said outputs of said first circuit means and effecting an additional 90° phase shift;

narrow-band filter means coupled to said second circuit means, said filter means having a resonant frequency corresponding to a desired tuning frequency and wherein an additional phase shift is imposed on the signal information translated therethrough for frequencies deviating from said resonant frequency; and product mixer means for simultaneously receiving signal information from the other output of said first circuit means and from said narrow-band filter means, and generating an output in response thereto, said output having a d-c component present whenever the signal translated through said filter means differs from the precise resonant frequency of said filter means.

2. A wideband discriminator in accordance with claim 1 wherein said first circuit means includes amplifier means having input, output and common electrode means and wherein said amplifier signal outputs of differing polarity are taken at said output and said common electrodes, respectively.

3. A wideband discriminator in accordance with claim 1 wherein said second circuit means includes a pair of amplifier means having input, output, and common electrodes, and wherein said additional 90° phase shift is effected by an inductive reactance interconnecting said common electrodes of said pair of amplifier means.

4. A wideband discriminator in accordance with claim 3 wherein said narrow-band filter means includes a parallel tuned circuit of an inductance and a capacitance connected across respective output electrodes of said pair of amplifier means.

5. A wideband discriminator in accordance with claim 4 wherein said amplifier means includes transistor amplifiers with common emitter electrodes interconnected by said inductance, output collector electrodes interconnected by said tuned, narrow-band filter, and base electrodes serving as respective input terminals.

6. A wideband discriminator in accordance with claim 1 wherein said first and second circuit means are transistor amplifiers and wherein said product mixer includes a pair of additional transistors serving as a synchronous switch with interconnected emitter electrodes forming one input thereof and respective base electrodes forming the other of the inputs, with respective collector electrodes forming output terminal points.

7. A wideband discriminator in accordance with claim 6 wherein a second transistorized synchronous switch serves as a second product mixer having output terminals connected in parallel with said output terminals of said first product mixer so as to provide a fully balanced circuit configuration.

8. A wideband discriminator in accordance with claim 1 wherein said first and second circuit means, and said product mixer means, are all disposed in a single integrated circuit.

9. A wideband discriminator in accordance with claim 8 wherein said transistor amplifier means forming said first circuit means includes base input electrodes to which push-pull signals developed by said source are to be applied.

10. A wideband discriminator arrangement with extended pull-in range in integrated circuit form, comprising in combination:

first and second transistors each with input-base, common-emitter and output-collector electrodes;

third and fourth transistors having a base-input electrode connected to an emitter electrode of a respective one of said first and second transistors, common-emitter electrodes interconnected through an inductive reactance, and output-collector electrodes;

a parallel-tuned circuit connected between said collector electrodes of said third and fourth transistors;

fifth and sixth transistors having emitter electrodes connected in common to said output-collector electrode of said first transistor, and base-input electrodes coupled to a respective one of said output-collector electrodes of said third and fourth transistors; and seventh and eighth transistors having emitter electrodes connected in common to said output-collector electrode of said second transistor, and base-input electrodes coupled to a respective one of said output-collector electrodes of said third and fourth transistors, said discriminator being adapted to receive push-pull control signals applied to respective base-input terminals of said first and second transistors.

* * * * *